United States Patent
Yeh et al.

(10) Patent No.: US 10,340,193 B2
(45) Date of Patent: Jul. 2, 2019

(54) FIN FIELD EFFECT TRANSISTOR AND MANUFACTURING METHOD THEREOF

(71) Applicant: REALTEK SEMICONDUCTOR CORP., Hsinchu (TW)

(72) Inventors: Ta-Hsun Yeh, Hsinchu (TW); Cheng-Wei Luo, Hsinchu (TW); Hsiao-Tsung Yen, Hsinchu (TW); Yuh-Sheng Jean, Hsinchu County (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 15/432,626

(22) Filed: Feb. 14, 2017

(65) Prior Publication Data
US 2017/0294356 A1    Oct. 12, 2017

(30) Foreign Application Priority Data
Apr. 6, 2016    (TW) .............................. 105110744 A

(51) Int. Cl.
| | | |
|---|---|---|
| *H01L 29/06* | (2006.01) | |
| *H01L 29/78* | (2006.01) | |
| *H01L 21/8234* | (2006.01) | |
| *H01L 27/088* | (2006.01) | |
| *H01L 21/3065* | (2006.01) | |
| *H01L 21/308* | (2006.01) | |
| *H01L 21/311* | (2006.01) | |
| *H01L 21/762* | (2006.01) | |

(52) U.S. Cl.
CPC .... *H01L 21/823481* (2013.01); *H01L 21/308* (2013.01); *H01L 21/3065* (2013.01); *H01L 21/31116* (2013.01); *H01L 21/31144* (2013.01); *H01L 21/76224* (2013.01); *H01L 21/76229* (2013.01); *H01L 21/823431* (2013.01); *H01L 27/0886* (2013.01); *H01L 29/0653* (2013.01); *H01L 29/785* (2013.01); *H01L 29/78* (2013.01); *H01L 29/7851* (2013.01)

(58) Field of Classification Search
CPC ......... H01L 21/823481; H01L 21/3065; H01L 21/308; H01L 21/31116; H01L 21/31144; H01L 21/76224; H01L 21/823431; H01L 27/0886; H01L 29/0653; H01L 29/7851; H01L 29/78
USPC ........................................................ 257/392
See application file for complete search history.

(56) References Cited

U.S. PATENT DOCUMENTS

| | | | | |
|---|---|---|---|---|
| 9,214,358 B1 * | 12/2015 | Lin | ......................... | H01L 29/66 |
| 2009/0057780 A1 * | 3/2009 | Wong | ..................... | H01L 21/845 |
| | | | | 257/401 |

(Continued)

FOREIGN PATENT DOCUMENTS

| | | |
|---|---|---|
| CN | 102891087 A | 1/2013 |
| CN | 104733390 A | 6/2015 |

*Primary Examiner* — Mohsen Ahmadi
*Assistant Examiner* — Patricia D Reddington
(74) *Attorney, Agent, or Firm* — Li & Cai Intellectual Property (USA) Office

(57) ABSTRACT

A fin field-effect transistor is provided. The fin field-effect transistor includes a substrate, a fin structure, a gate-stacked structure, and an isolation structure. The fin structure is disposed on the substrate, and the gate-stacked structure covers the fin structure. The isolation structure disposed on the substrate to isolate the gate-stacked structure from the substrate has different thicknesses in different portions.

15 Claims, 13 Drawing Sheets

(56) References Cited

U.S. PATENT DOCUMENTS

| | | | |
|---|---|---|---|
| 2011/0312152 A1* | 12/2011 | Kim | H01L 21/31116 438/397 |
| 2013/0020640 A1* | 1/2013 | Chen | H01L 29/66795 257/347 |
| 2014/0077303 A1* | 3/2014 | Baek | G06F 17/5063 257/365 |
| 2016/0247925 A1* | 8/2016 | Kwon | H01L 21/823431 |
| 2016/0293750 A1* | 10/2016 | Kim | H01L 29/7848 |
| 2017/0103923 A1* | 4/2017 | Nidhi | H01L 21/823412 |
| 2017/0294355 A1* | 10/2017 | Kim | H01L 27/0924 |

* cited by examiner

FIN FIELD EFFECT TRANSISTOR AND MANUFACTURING METHOD THEREOF

BACKGROUND OF THE INVENTION

1. Field of the Invention

The instant disclosure relates to a semiconductor device and a manufacturing method thereof; in particular, to a fin field-effect transistor and manufacturing method thereof.

2. Description of Related Art

A conventional fin field-effect transistor (FinFET) includes a plurality of fin plates formed on a substrate, a gate layer covering two opposite side surfaces of each fin plate, and a gate dielectric layer between the gate layer and each fin plate. Additionally, each of the fin plates is doped to form a source and a drain respectively located at two opposite sides of the gate layer. Upon applying a bias to the FinFET, an inverse channel is induced at two opposite sidewalls and the top portion of each fin plate.

The effective channel width (Weff) of the FinFET is relative to a height with which each fin plate protrudes from shallow trench isolation (STI), a thickness of each fin plate, and a number of the fin plates.

Since the threshold current of the FinFET is proportional to the effective channel width, the effective channel width of the FinFET is usually adjusted by the designer according to the demands of the integrated circuit design so as to adjust the threshold current of the FinFET. However, the designer cannot casually adjust the effective channel width excluding by changing the number of the fin plates due to the process limitations. As such, it is difficult to fine tune the effective channel width of the FinFET to satisfy the practical demands of integrated circuit design.

SUMMARY OF THE INVENTION

In order to achieve the aforementioned objects, a fin field-effect transistor is provided in the instant disclosure. By adjusting the height difference between the top surface of a fin and the top surface of an isolation layer, which can be achieved by adjusting the thickness of the isolation layer, it is possible to fine tune the effective channel width of the fin field-effect transistor.

A fin field-effect transistor provided in one of the embodiments of the instant disclosure includes a substrate, a fin structure, an isolation structure, and a gate-stacked structure. The fin structure is disposed on the substrate, in which the fin structure includes a plurality of trenches. The isolation structure is arranged on the substrate and in the trenches, in which the isolation structure has different thicknesses in different portions thereof. The gate-stacked structure covers the fin structure and the isolation structure.

According to another embodiment of the instant disclosure, a manufacturing method of a fin field-effect trench power transistor is provided. The manufacturing method includes the following steps: forming a fin structure on a substrate, in which the fin structure includes a plurality of trenches; forming an isolation structure disposed on the substrate and arranged in the trenches, in which the isolation structure has different thicknesses at different portions; and forming a gate-stacked structure to cover the fin structure and the isolation structure.

To sum up, the fin field-effect transistor and the manufacturing method thereof provided in the instant disclosure can be suitable for different integrated circuit designs by fine tuning the effective channel width, which can be achieved by making the isolation structure have different thicknesses in different portions.

In order to further the understanding regarding the instant disclosure, the following embodiments are provided along with illustrations to facilitate the disclosure of the instant disclosure.

DETAILED DESCRIPTION OF THE PREFERRED EMBODIMENTS

Figure 1:
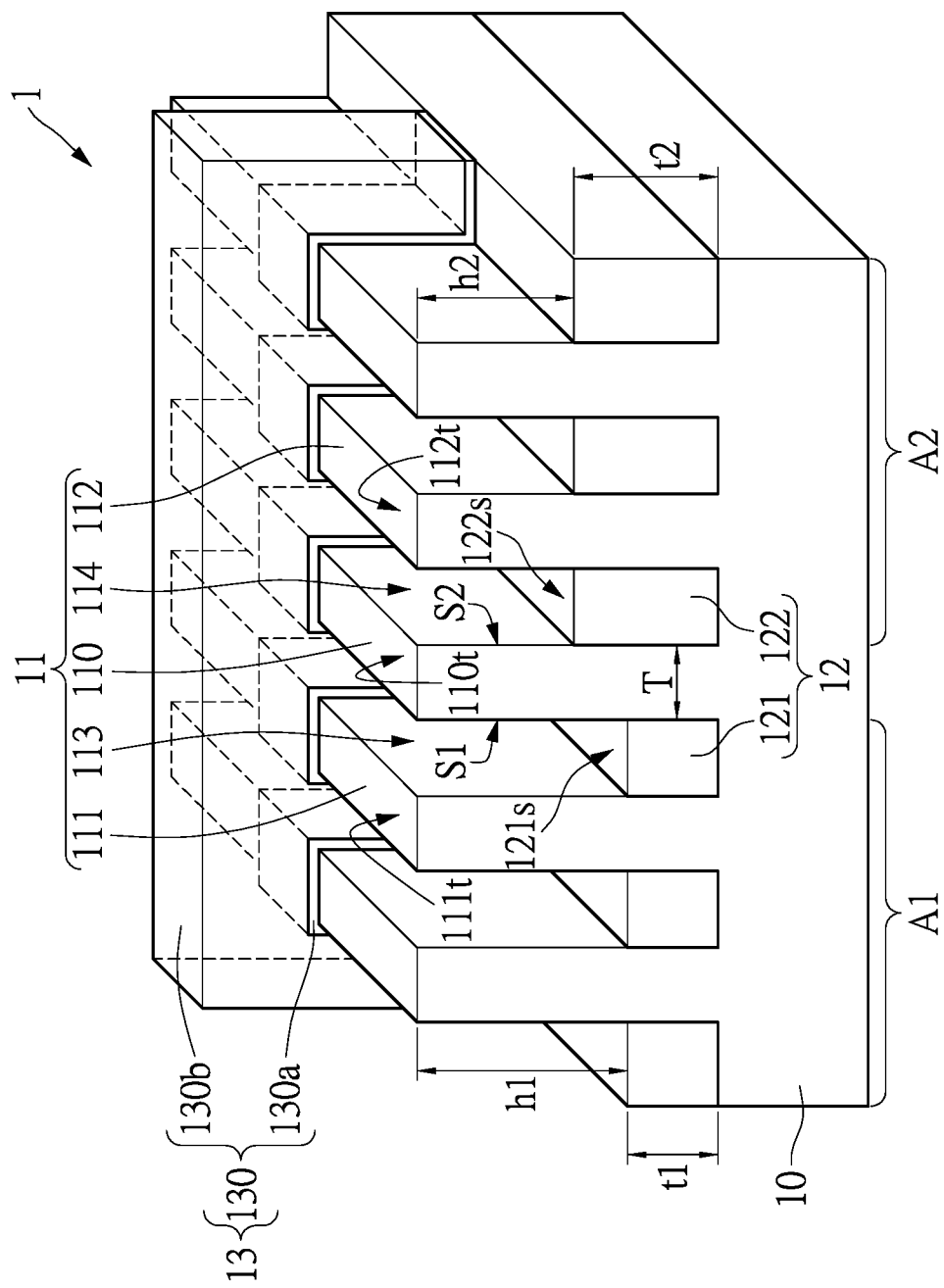
FIG. 1 shows a perspective view of a localized fin field-effect transistor according to an embodiment of the instant disclosure.
Figure 1A:
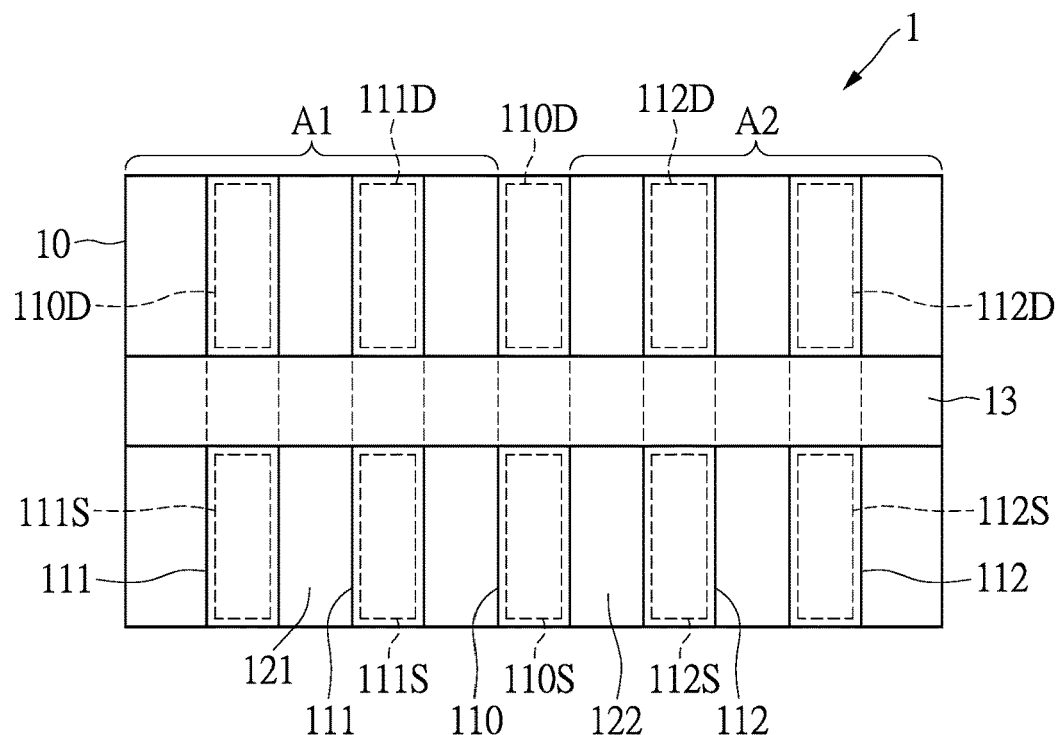
FIG. 1A shows a top view of the fin field-effect transistor shown in FIG. 1.
Figure 1B:
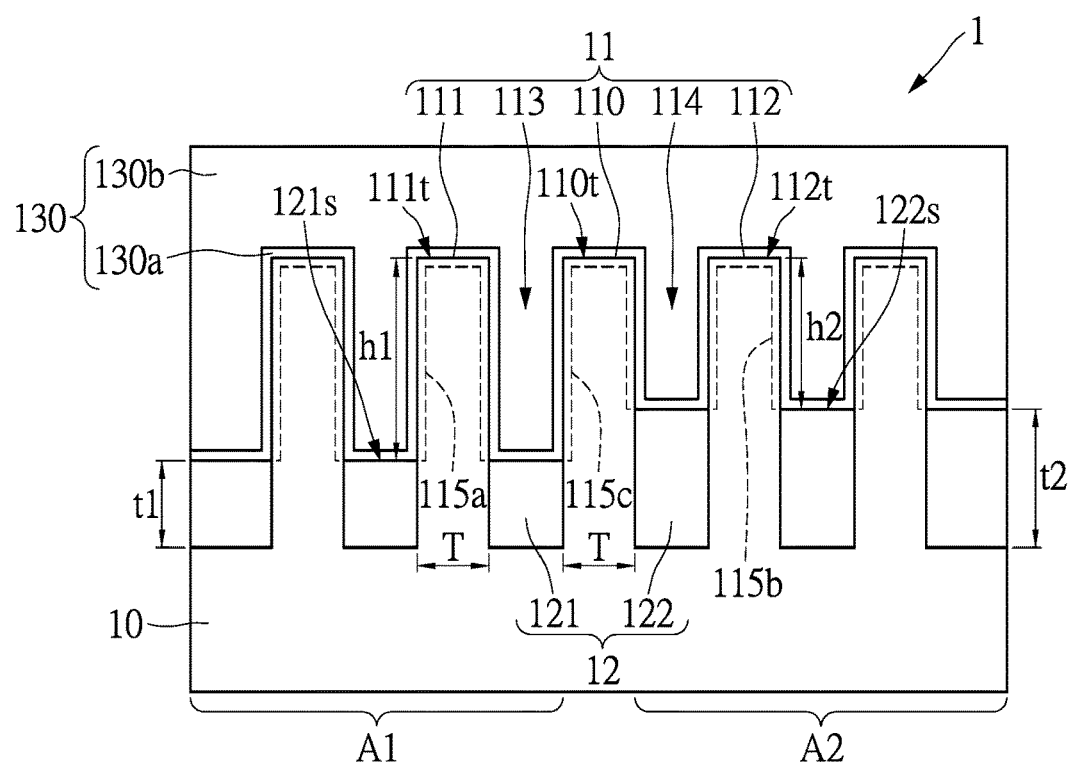
FIG. 1B shows a cross-sectional view of the fin field-effect transistor shown in FIG. 1.

Please refer to FIG. 1, FIG. 1A and FIG. 1B. The fin field-effect transistor 1 of the instant embodiment includes a substrate 10, a fin structure 11, an isolation structure 12 and a gate-stacked structure 13. The fin structure 11 is disposed on the substrate 10, and the gate-stacked structure 13 covers the fin structure 11 and is isolated from the substrate 10 by the isolation structure 12. The fin field-effect transistor 1 having an adjustable effective channel width based on the integrated circuit design can be implemented in a ring oscillator or a memory device.

In the instant embodiment, the substrate 10 is made of semiconductor material, such as silicon (Si), gallium nitride (GaN), aluminum nitride (AlN), silicon carbide (SiC), indium phosphide (InP), zirconium selenium (ZnSe), the other Group IV semiconductors, III-V or II-VI compounds semiconductors. The substrate 10 is doped with first conductivity type impurities, which may be N-type or P-type impurities. The substrate 10 can be divided into at least a first device region A1 and a second device region A2.

As shown in FIG. 1, the fin structure 11 is disposed on the substrate 10. Specifically, the fin structure 11 includes a plurality of first fins 111 positioned at the first device region A1, a plurality of second fins 112 positioned at the second device region A2, and a partition fin 110 located between the first and second device regions A1, A2. The first fins 111, the second fins 112 and the partition fin 110 are arranged in parallel on the substrate 10 and extend along substantially the same direction.

Referring to FIG. 1A, each of the first fins 111, the second fins 112 and the partition fin 110 is locally doped with second conductivity type impurities to form source regions 111S, 110S, 112S and drain regions 111D, 110D, 112D, which are respectively formed in each first fin 111, each second fin 112 and the partition fin 110. All of the source regions 111S, 110S, 112S and the drain regions 111D, 110D, 112D have the same conductivity type, which is opposite to that of the substrate 10. In one embodiment, the source regions 111S, 110S, 112S are electrically connected to a source contact, and the drain regions 111D, 110D, 112D are electrically connected to a drain contact. The source contact and the drain contact are electrically connected to an external control circuit.

Please refer to FIG. 1. The partition fin 110 includes a first sidewall surface S1 and a second sidewall surface S2 opposite to the first sidewall surface S1. The first sidewall surface S1 is closer to and faces to the first device region A1, and the second sidewall surface S2 is closer to and faces to the second device region A2.

Moreover, in the instant embodiment, the fin structure 11 includes a plurality of first trenches 113 positioned at the first device region A1 and a plurality of second trenches 114 positioned at the second device region A2. The first trenches 113 and the second trenches 114 have substantially the same width. In the embodiment shown in FIG. 1, the first trench 113 defined among the first fin 111, the partition fin 110 and the substrate 10 and the second trench 114 among the second fin 112, the partition fin 110 and the substrate 10 are taken as an example for description.

The isolation structure 12, which has different thicknesses, is located in the first trench 113 and the second trench 114 to isolate the gate-stacked structure 13 from the substrate 10. The isolation structure 12 is made of dielectric material, such as silicon oxide, silicon nitride or other insulators.

Specifically, as shown in FIG. 1, the isolation structure 12 includes a first isolation portion 121 positioned in the first device region A1 and a second isolation portion 122 positioned in the second device region A2. The first isolation portion 121 is located in the first trench 113, and the second isolation portion 122 is located in the second trench 114. As shown in FIG. 1 the first sidewall surface S1 and the second sidewall surface S2 of the partition fin 110 respectively connect to the first isolation portion 121 and the second isolation portion 122.

Additionally, the first isolation portion 121 has a first thickness t1 less than a second thickness t2 of the second isolation portion 122. That is, the portions of the isolation structure 12 respectively in first device region A1 and in second device region A2 have different thicknesses.

Please refer to FIG. 1B. In the instant embodiment, the vertical distance between a top surface 110t of the partition fin 110 and a top surface 121s of the first isolation portion 121 is a first height h1 with which the first fin 110 protrudes from the top surface 121s of the first isolation portion 121. Additionally, the vertical distance between the top surface 110t of the partition fin 110 and the top surface 122s of the second isolation portion 122 is the second height h2 with which the second fin 112 protrudes from the top surface 122s of the second isolation portion 122.

As shown in FIG. 1B, the vertical distance (i.e., the first height h1) between the top surface 110t of the partition fin 110 and the top surface 121s of the first isolation portion 121 is larger than that (i.e., the second height h2) between the top surface 110t of the partition fin 110 and the top surface 122s of the second isolation portion 122.

Please refer to FIG. 1. The gate-stacked structure 13 covering the fin structure 11 and the isolation structure 12 can be electrically connected to the external control circuit. Under applying a bias to the gate-stacked structure 13, an inversion channel is induced in the fin structure 11.

Specifically, the gate-stacked structure 13 includes a plurality of gate-stacked stripes 130 (only one shown in FIG. 1), and each of the gate-stacked stripes 130 has an extending direction intersecting with those of the first fins 111, the second fins 112, and the partition fin 110. In one embodiment, the extending direction of each gate-stacked stripe 130 is substantially perpendicular to those of the first fin 111, the second fin 112, and the partition fin 110.

Please refer to FIG. 1. In the instant embodiment, each of the gate-stacked stripes 130 extends from the first device region A1 to the second device region A2. Specifically, each gate-stacked stripe 130 surrounds each first fin 111, each second fin 112, and the partition fin 110 by partially covering two opposite sidewalls and top surface 111t of each first fin 111, two opposite sidewalls and top surface 112t of each second fin 112, the first sidewall surface S1, the second sidewall surface S2, and the top surface 110t of the partition fin 110. Moreover, the gate-stacked stripe 130 covers the top surface 121s of the first isolation portion 121 and the top surface 122s of the second isolation portion 122.

Each of the gate-stacked stripes 130 includes a gate insulating layer 130a and a gate conductive layer 130b, and portions of the gate insulating layer 130a are respectively interlayered between the gate conductive layer 130b and the first fin 111, between the gate conductive layer 130b and the second fin 112, and between the gate conductive layer 130b and the partition fin 110. The gate insulating layer 130a can be made of high-dielectric material, such as $Ta_2O_5$, HfSiO, HfSiON, $HfO_2$, $ZrO_2$, ZrSiO, ZrSiON, TaSiO, or the like. The conductive layer 130b disposed on the gate insulating layer 130a can be made of heavily-doped polysilicon, metal, metal silicide, or other conductive materials.

Please refer to FIG. 1A. The gate-stacked stripe 130 is located between the source regions 111S, 110S, 112S and the drain regions 111D, 110D, 112D of the first fin 111, the second fin 112, and the partition fin 110.

Please refer to FIG. 1A and FIG. 1B. Upon applying a bias to the gate-stacked stripe 130, the source region 111S, 110S, 112S, and the drain regions 111D, 110D, 112D, the inversion channels 115a-115c are generated in the portions, which are surrounded by the gate-stacked stripe 130, of the first fin 111, the second fin 112, and the partition fin 110.

As shown in FIG. 1B, an inversion channel width (Weff1) of each first fin 111 is equal to a sum of the twice the first height h1 and a width T of each first fin 111. That is, Weff1=2h1+T. Similarly, an inversion channel width (Weff2) of each second fin 112 is equal to a sum of twice the second height h2 and a width T of the second fin 112, i.e., Weff2=2h2+T. As the same reason, an inversion channel width (Weff0) of the partition fin 110 is equal to a sum of the first height h1, the second height h2, and the width T of the partition fin 110, namely, Weff0=h1+h2+T.

As mentioned above, the first height h1 (or the second height h2) is proportional to the inversion channel width of each first fin 111 (or each second fin 112), and the first height h1 is greater than the second height h2. As such, the inversion channel width (Weff1) of each first fin 111 is greater than that (Weff2) of each second fin 112.

In another embodiment, the second thickness t2 of the second isolation portion 122 can be less than the first thickness t1 of the first isolation portion 121, such that the inversion channel width (Weff1) of the first fin 111 is less than that (Weff2) of the second fin 112. Accordingly, by adjusting the thicknesses of the isolation structure 12 in different portions, the effective channel width of the fin field-effect transistor 1 becomes adjustable for different integrated circuit designs.

Figure 2:
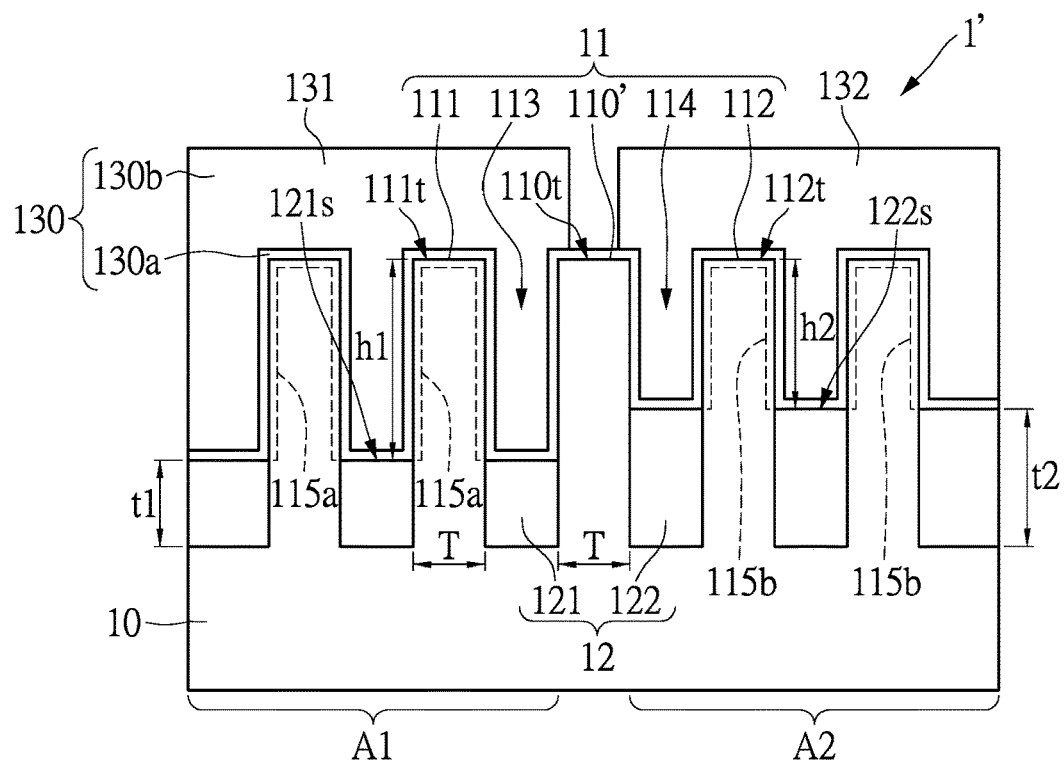
FIG. 2 shows a cross-sectional view of a fin field-effect transistor according to another embodiment of the instant disclosure.

Please refer to FIG. 2. A difference between the fin field-effect transistor 1' shown in FIG. 2 and that shown in FIG. 1 is that the partition fin 110' is a dummy fin. That is, unlike the source regions 111S, 112S and the drain regions 111D, 112D of the first and second fins 111, 112, the source region 110S and the drain region 110D of the partition fin 110' are not electrically connected to the external control circuit.

Moreover, in this case, the gate-stacked stripe 130 can include a first stacked portion 131 covering at least one first fin 111 and a second stacked portion 132 covering at least one second fin 112. The first and second stacked portions 131, 132 are separated from each other to expose a portion, which is located on the top surface 110t of the partition fin 110', of the gate insulating layer 130a. Accordingly, upon applying a bias to the fin field-effect transistor 1', only the inversion channels 115a, 115b are induced in the first and second fins 111, 112, and no inversion channel is formed in the partition fin 110'. In another embodiment, neither source region nor drain region is formed in the partition fin 110'.

Figure 3:
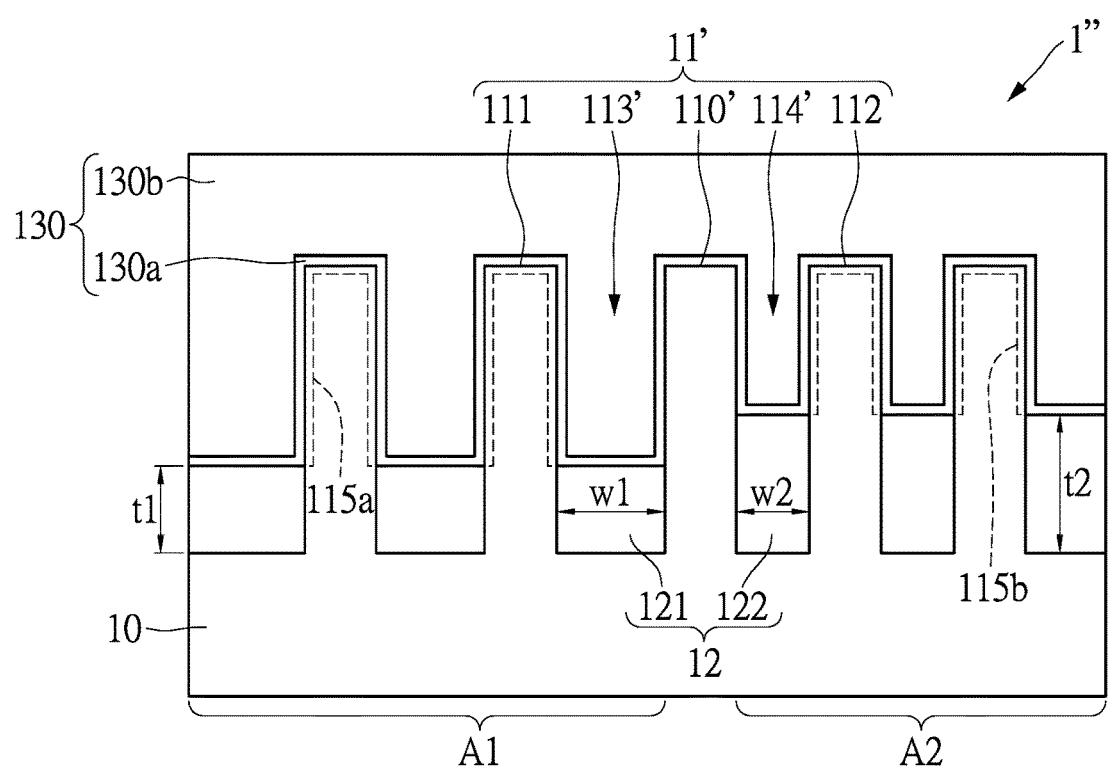
FIG. 3 shows a cross-sectional view of a fin field-effect transistor according to another embodiment of the instant disclosure.

Please refer to FIG. 3. A difference between the fin field-effect transistor 1" and that shown in FIG. 1 is that the first trench 113' and the second trench 114' have different widths. In the embodiment shown in FIG. 3, the width (w1) of the first trench 113' is larger than the width (w2) of the second trench 114'. Moreover, the first isolation portion 121 positioned in the first trench 113' has a thickness t1 less than a thickness t2 of the second isolation portion 122 positioned in the second trench 114', such that the inversion channel width (Weff1) of the first fin 111 is greater than that (Weff2) of the second fin 112.

Figure 4:
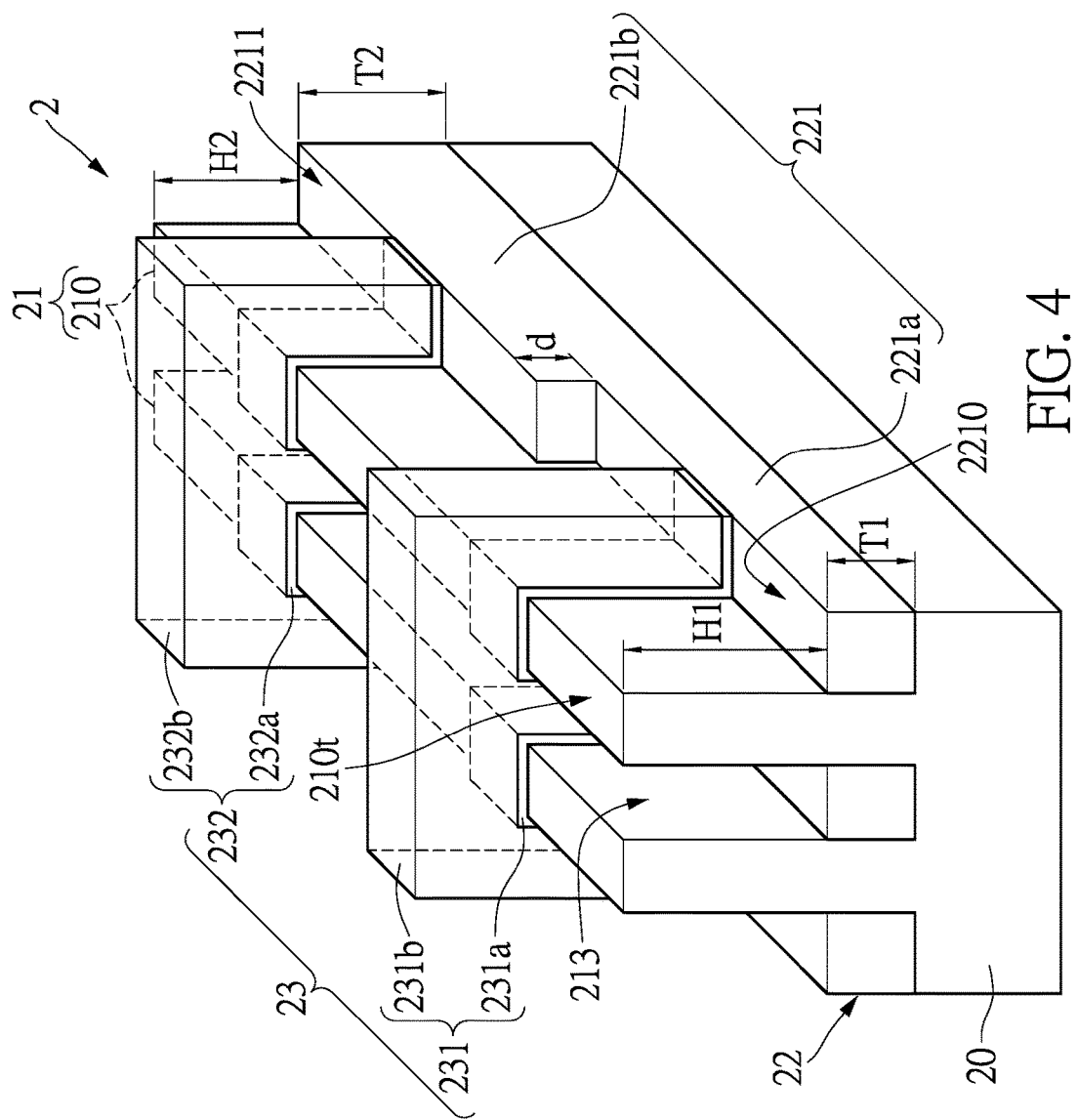
FIG. 4 shows a perspective view of a localized fin field-effect transistor according to an embodiment of the instant disclosure.

Please refer to FIG. 4. The fin field-effect transistor 2 shown in FIG. 4 includes a substrate 20, a fin structure 21, an isolation structure 22, and a gate-stacked structure 23.

The fin structure 21 includes a plurality of fins 210 and a plurality of trenches 213. The fins 210 have substantially the same extending direction and are arranged on the substrate 20. Each of trenches 213 is defined between two immediately adjacent fins 210. Additionally, the isolation structure 22 includes a plurality of isolation portions 221. The isolation portions 221 are respectively arranged in the trenches 213. Accordingly, each of the fins 210 has at least one sidewall surface connecting to the isolation portion 221.

As shown in FIG. 4, each of isolation portions 221 is divided into a front part 221a and a rear part 221b connecting the front part 221a, along the extending direction of the trench 213 (or the fin 210). There exists a predetermined height difference d between the front part 221a and the rear part 221b. Specifically, in the instant embodiment, the front part 221a has a thickness T1 with respect to the substrate 20 less than that (T2) of the rear part 221b, such that the predetermined height difference (d) exists between the front part 221a and the rear part 221b.

Accordingly, a vertical distance between the top surface 210t of each fin 210 and the top surface 2210 of the front part 221a is greater than that between the top surface 210t of each fin 210 and the top surface 2211 of the rear part 221b. Namely, the fin 210 protrudes from the top surface 2210 of the front part 221a with a first height H1 and protrudes from the top surface 2211 of the rear part 221b with a second height H2, in which the first height H1 is larger than the second height H2.

Moreover, the gate-stacked structure 23 of the instant embodiment includes a first gate-stacked stripe 231 and a second gate-stacked stripe 232, both of which cover the fins 210. The first gate-stacked stripe 231 and the second gate-stacked stripe 232 have substantially the same extending direction, which intersects with the extending direction of the fin 210. The first gate-stacked stripe 231 includes a first gate insulating layer 231a and a first gate conductive layer 231b covering the first gate insulating layer 231a. Similarly, the second gate-stacked stripe 232 includes a second gate insulating layer 232a and a second gate conductive layer 232b covering the second insulating layer 232a.

In the instant embodiment, the first gate-stacked stripe 231 covers at least one front part 221a of the isolation portion 221, and the second gate-stacked stripe 232 covers at least one rear part 221b of the isolation portion 221.

In other words, upon applying a bias to the fin field-effect transistor 2, a width of the inversion channel induced at a region of the fin 210 covered by the first gate-stacked stripe 231 is greater than that of the inversion channel induced at the other region of the fin 210 covered by the second gate-stacked stripe 232. Accordingly, by making the isolation portion 221 formed in the same trench 213 have different thicknesses respectively in different regions, the effective channel width of the fin field-effect transistor 2 becomes adjustable.

Figure 5:
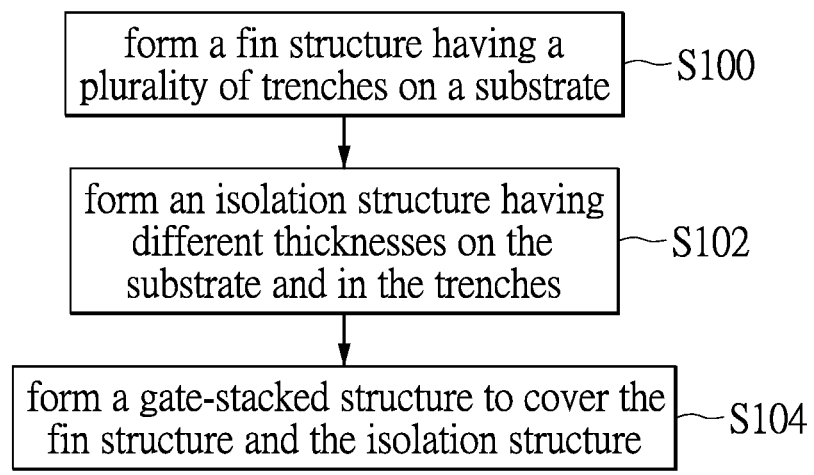
FIG. 5 shows a flowchart of a manufacturing method of a fin field-effect transistor according to an embodiment of the instant disclosure.

Please refer to FIG. 5. In the embodiment of the instant disclosure, a manufacturing method of fin field-effect transistor is provided. In step S100, a fin structure having a plurality of trenches is formed on a substrate. In step S102, an isolation structure having different thicknesses is formed on the substrate and in the trenches. Subsequently, in step S104, a gate-stacked structure is formed to cover the fin structure and the isolation structure.

Figure 6A:
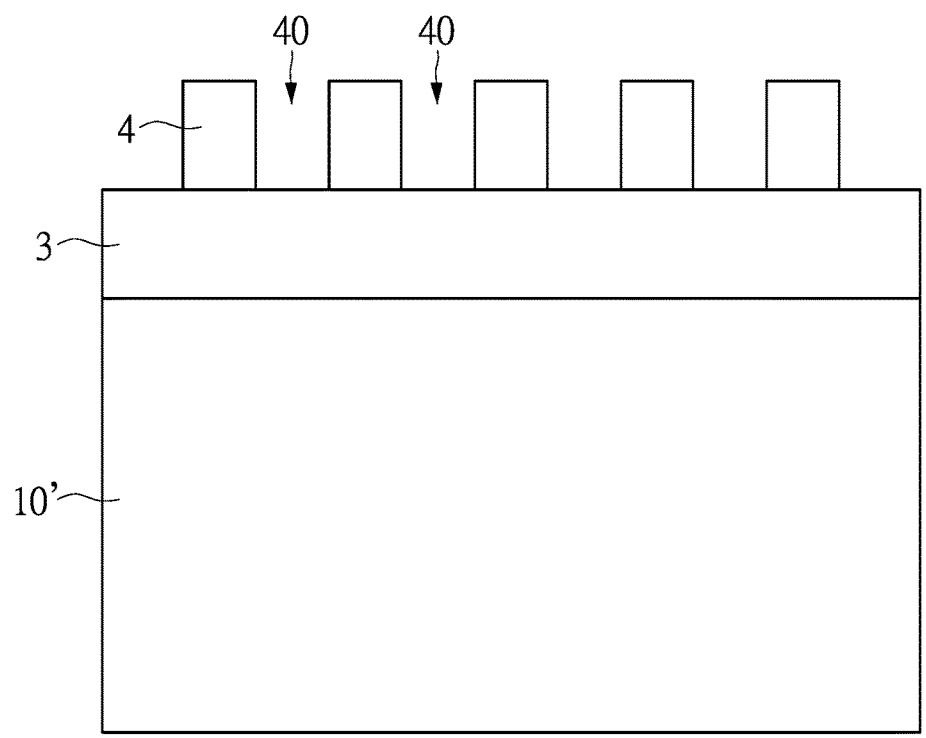
FIG. 6A to FIG. 6J respectively show cross-sectional views of a localized fin field-effect transistor in different steps according to an embodiment of the instant disclosure.

Subsequently, referring to FIG. 6A to FIG. 6J, the manufacturing method of the fin field-effect transistor shown in FIG. 1 is further described. Please refer to FIG. 6A to FIG. 6C, which show the step S100 in detail. As shown in FIG. 6A, an initial hard mask 3 is formed on an initial substrate 10', and then a photoresist layer 4 is formed on the initial hard mask 3. The photoresist layer 4 has a plurality of photoresist openings 40 to define the positions of the trenches.

Figure 6B:
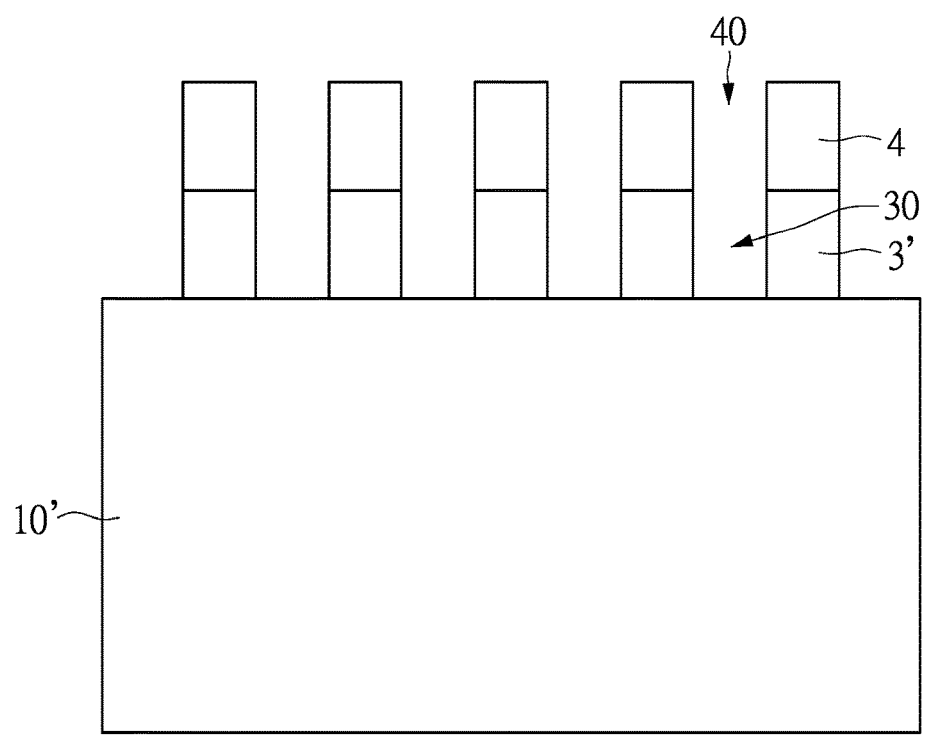

As shown in FIG. 6B, the initial hard mask 3 is etched through the photoresist layer 4 to form a hard mask 3' having a plurality of openings 30. The openings 30 are respectively in communication with the photoresist openings 40. Subsequently, as depicted in the FIG. 6C, the initial substrate 10' is etched through the photoresist layer 4 and the hard mask 3' to form a substrate 10 and the fin structure 11 having a plurality of trenches. Thereafter, the photoresist layer 4 is removed.

In one embodiment, the initial substrate 10' can be etched by a dry etching process or a wet etching process to form the fin structure 11 through the photoresist layer 4 and the hard mask 3'.

In one embodiment, the etchant used in wet etching process can include tetramethylammonium hydroxide (TMAH), a $HF/HNO_3/CH_3COOH$ solution, $NH_4OH$, KOH, the combination thereof, or other suitable solutions. The dry etching process is a biased plasma etching process that uses a chlorine-based chemistry, and the gas used in the dry etching process can be $CF_4$, $NF_3$, $SF_6$, and He. An anisotropic etch can be performed by the dry etching process, such as a deep reactive-ion etching (DRIE) process, on the initial substrate 10'.

Moreover, the substrate 10 is divided into a first device region A1 and a second device region A2. Some of the trenches positioned at the first device region A1 are defined as first trenches 113, and other trenches positioned at the second device region A2 are defined as second trenches 114. The fin structure 11 includes a plurality of first fins 111 positioned at the first device region A1, a plurality of second fins 112 positioned at the second device region A2, and at least one partition fin 110 positioned between the first device region A1 and the second device region A2.

Figure 6C:
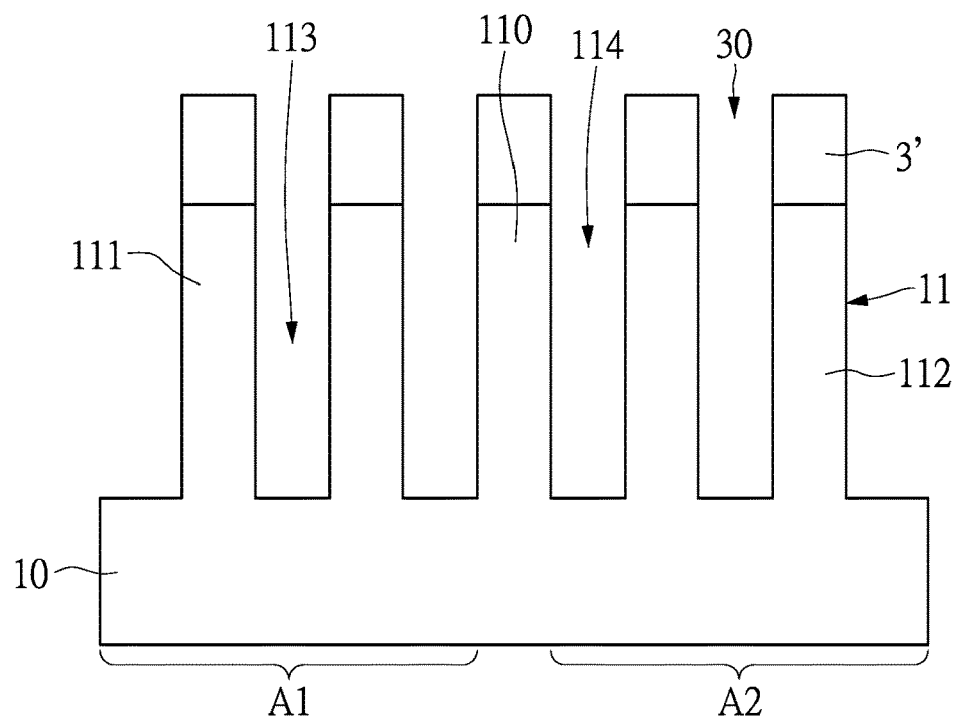
Figure 6D:
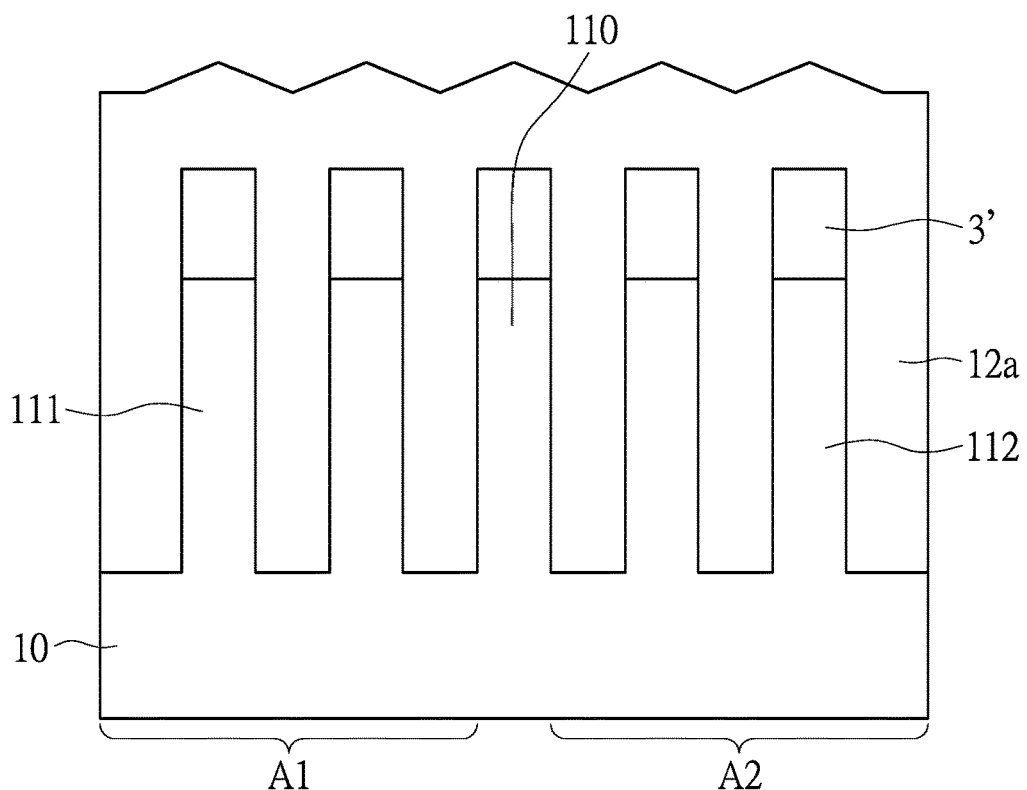
Figure 6E:
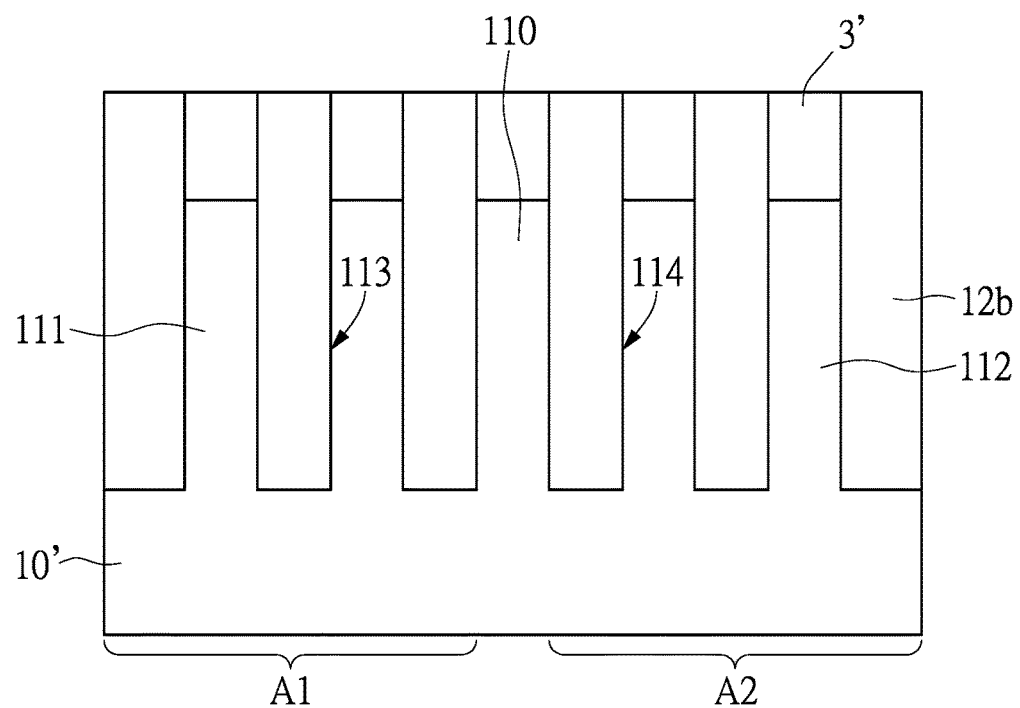

Please refer to FIG. 6D to FIG. 6E, which show the step S102 in detail. As shown in FIG. 6D, an initial isolation material 12a is deposited to cover the fin structure 11 and to fill the trenches (including the first and second trenches 113, 114) and the hard mask openings 30, which are respectively in fluid communication with the trenches. The initial isolation material 12a is an electrical insulating material and can be formed by physical or chemical vapor deposition process. Subsequently, as shown in FIG. 6E, a portion of the initial isolation material 12a is removed to expose a top face of the hard mask 3'.

Figure 6F:
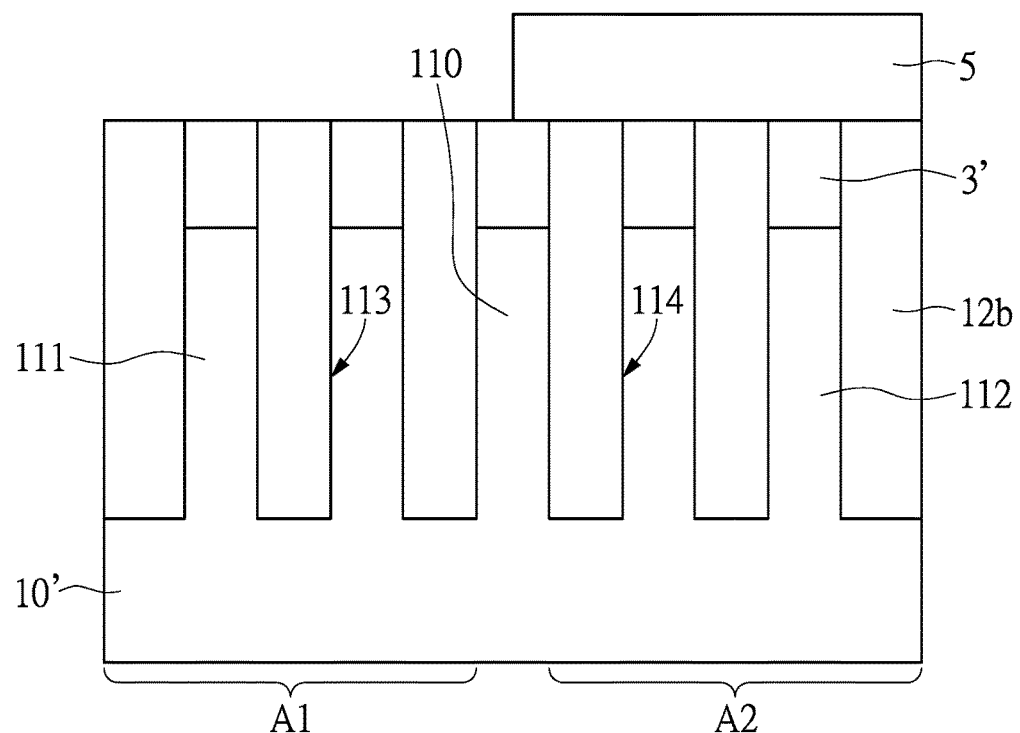
Figure 6G:
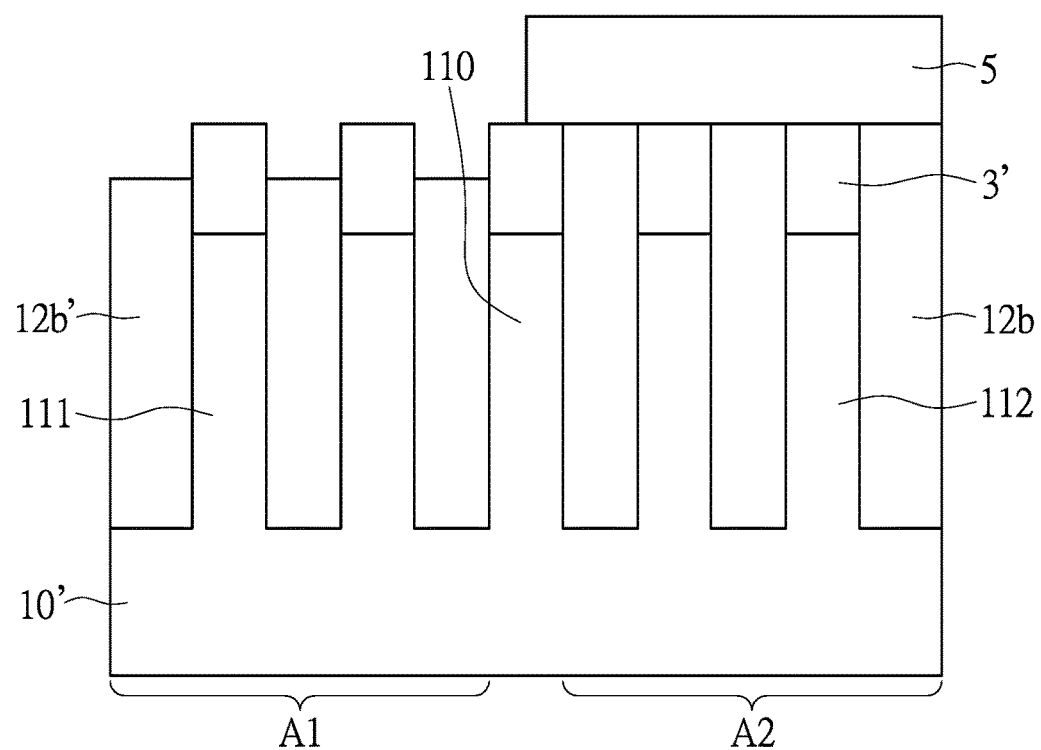

Subsequently, two etching steps are performed to etch the isolation material 12b arranged in the first and second trenches 113, 114. As shown in FIG. 6F, a patterned shielding mask 5 is formed to expose the isolation material 12b positioned at the first device region A1 and cover the isolation material 12b positioned at the second device region A2. Thereafter, as shown in FIG. 6G, a first etching process is performed through the patterned shielding mask 5 to remove a part of the isolation material 12b positioned at the first device region A1 so that an isolation material 12b' formed in the first device region A1 is thinner than the isolation material 12b formed in the second device region A2.

Figure 6H:
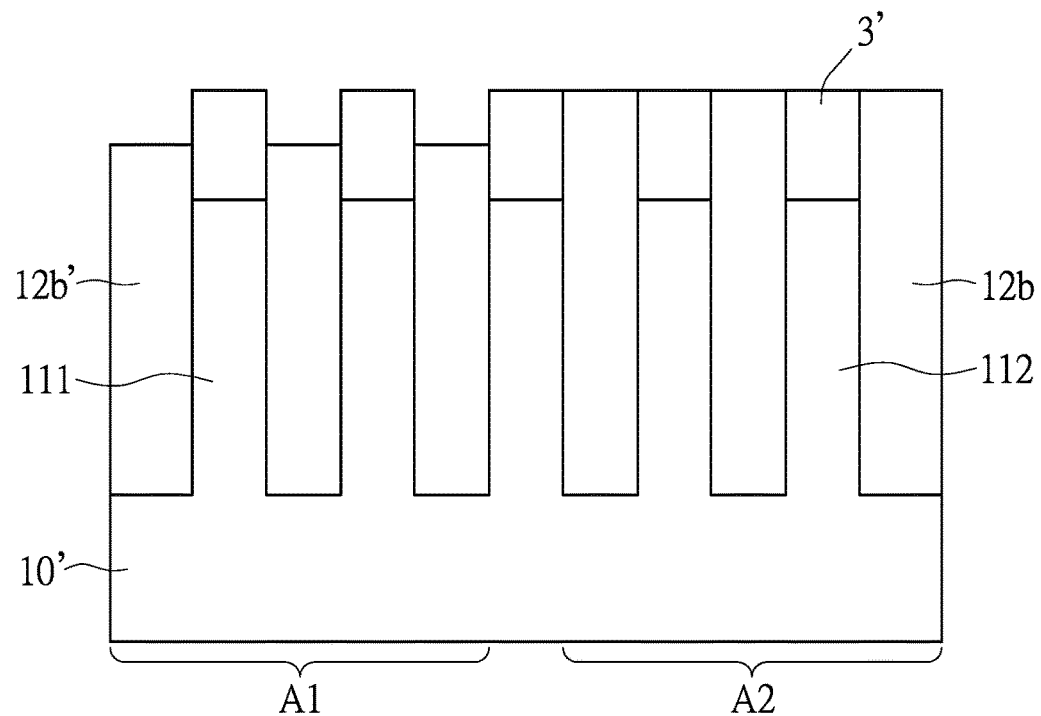
Figure 6I:
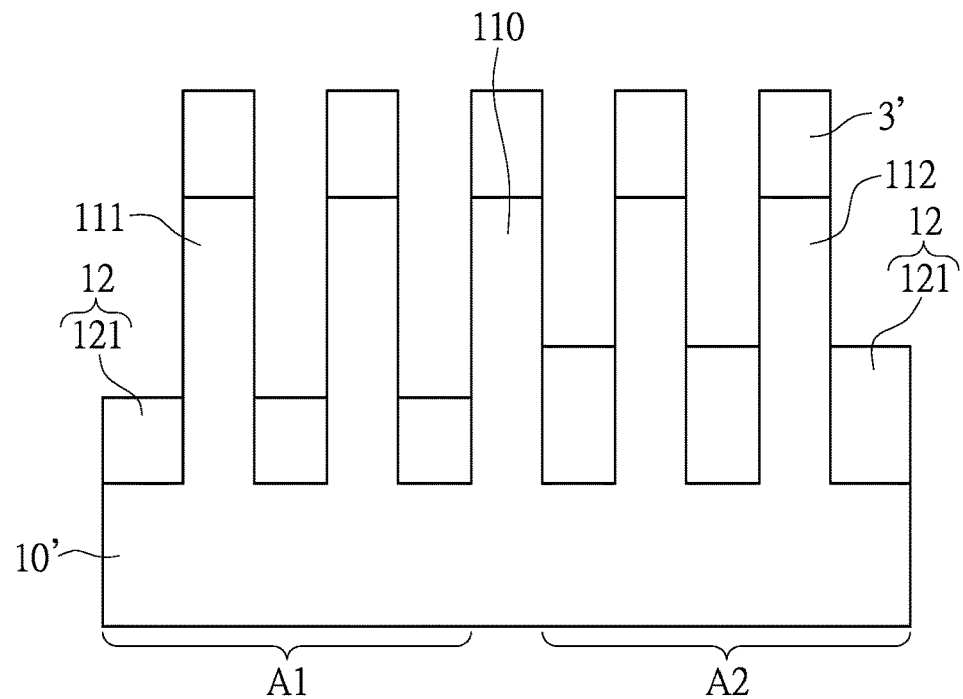
Figure 6J:
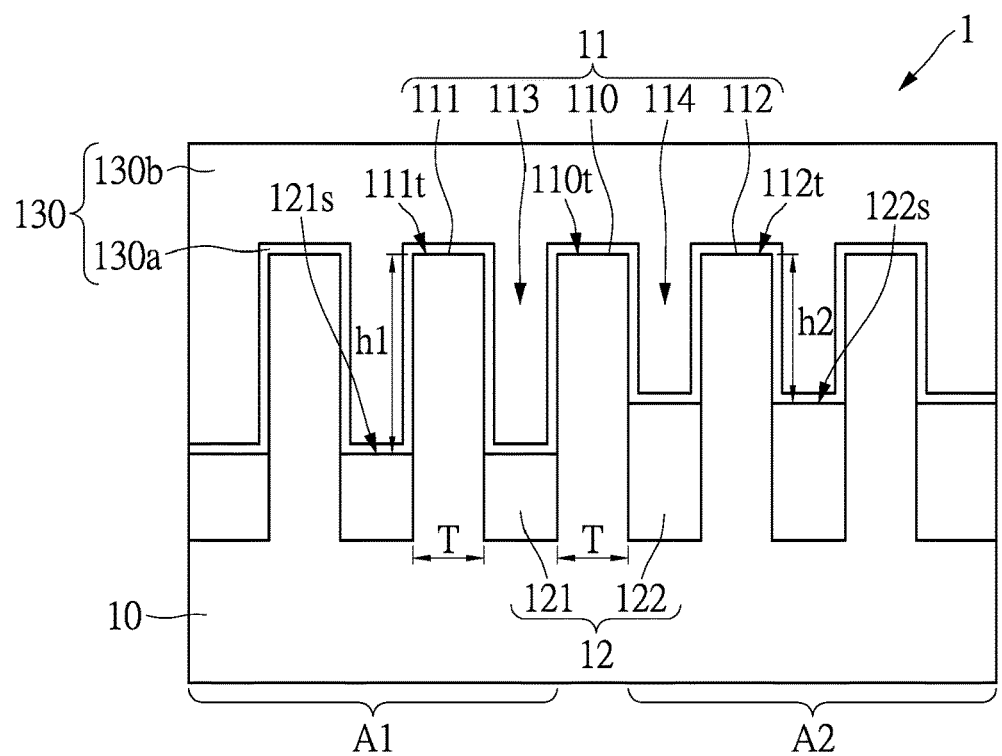

Please refer to FIGS. 6H and 6I. After the patterned shielding mask 5 is removed, a second etching process is performed to simultaneously remove a portion of the isolation material 12b' positioned at the first device region A1 and a portion of the isolation material 12b positioned at the second device region A2 so as to form the isolation structure 12.

The isolation structure 12 includes a first isolation portion 121 and a second isolation portion 122, which are respectively arranged in the first device region A1 and the second device region A2. The first and second isolation portions 121, 122 have different thicknesses. Please refer to FIG. 6J. A gate insulating layer 130a and a gate conductive layer 130b are sequentially formed to cover the fin structure 11, and fabrication of the fin field-effect transistor 1 shown in FIG. 1 is completed.

Notably, by changing the pattern of the patterned shielding mask 5 shown in FIG. 6F, the isolation portion formed in the same trench can have different thicknesses respectively in the front part and in the rear part. Accordingly, the abovementioned processes also can be used to fabricate the fin field-effect transistor 2 shown in FIG. 4.

Please refer to FIG. 7A to FIG. 7F. The manufacturing method of fin field-effect transistor according to another embodiment of the instant disclosure is described by taking the fin field-effect transistor 1" shown in FIG. 3 as an example.

Figure 7A:
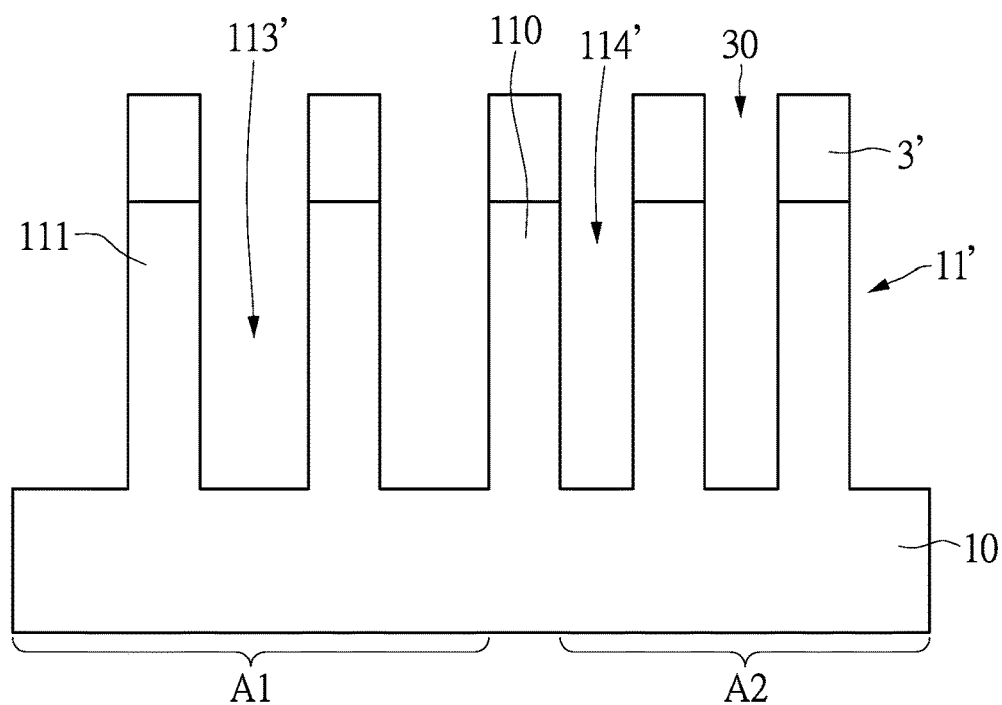
FIG. 7A to FIG. 7F respectively show cross-sectional views of a localized fin field-effect transistor in different steps according to another embodiment of the instant disclosure.

Please refer to FIG. 7A, similar to the process shown in FIG. 6C, a fin structure 11' having a plurality of trenches is formed on the substrate 10, and the widths of the trenches are different. Specifically, the substrate 10 is divided into the first device region A1 and the second device region A2, some of the trenches positioned at the first device region A1 are defined as the first trenches 113', and other trenches positioned at the second device region A2 are defined as the second trenches 114'. The trenches 113' and the trenches 114' respectively have different widths. The fin structure 11' includes a plurality of first fins 111 positioned in the first device region A1, a plurality of second fins 112 positioned in the second device region A2, and at least one partition fin 110 positioned between the first and second device regions A1, A2. The hard mask 3' is still remained on each of the first fins 111, the second fins 112, and the partition fin 110.

Figure 7B:
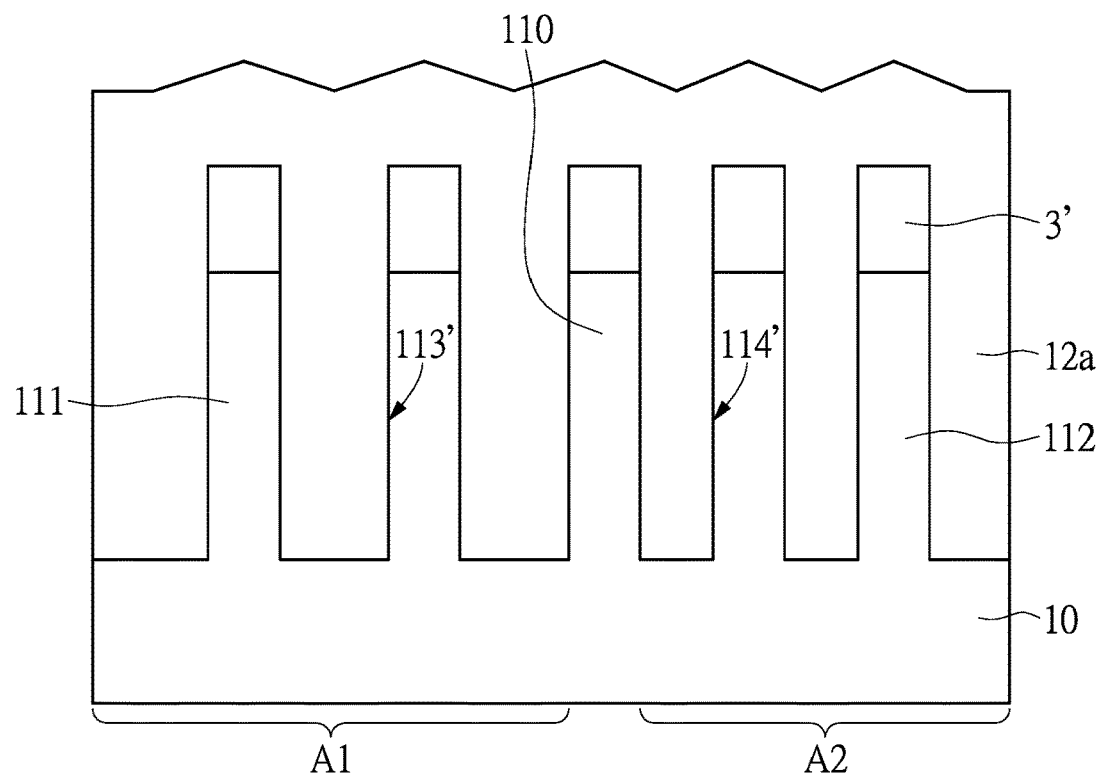
Figure 7C:
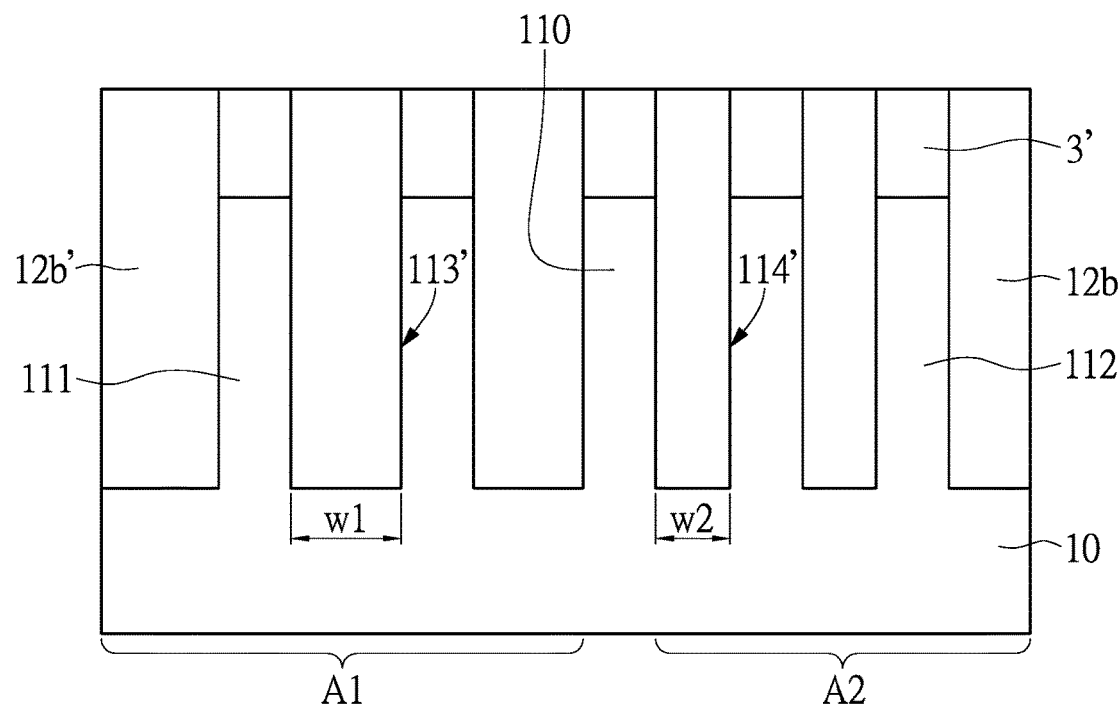

Please refer to FIG. 7B to FIG. 7E, which show another embodiment of the step S102 shown in FIG. 5 in detail. As shown in FIG. 7B, the initial isolation material 12a is formed to cover the fin structure 11' and to fill the trenches (including the first and second trenches 113', 114') and the hard mask openings 30, which are respectively in fluid communication with the trenches. Thereafter, a portion of the initial isolation material is removed to expose the top face of the hard mask 3', as shown in FIG. 7C.

Figure 7D:
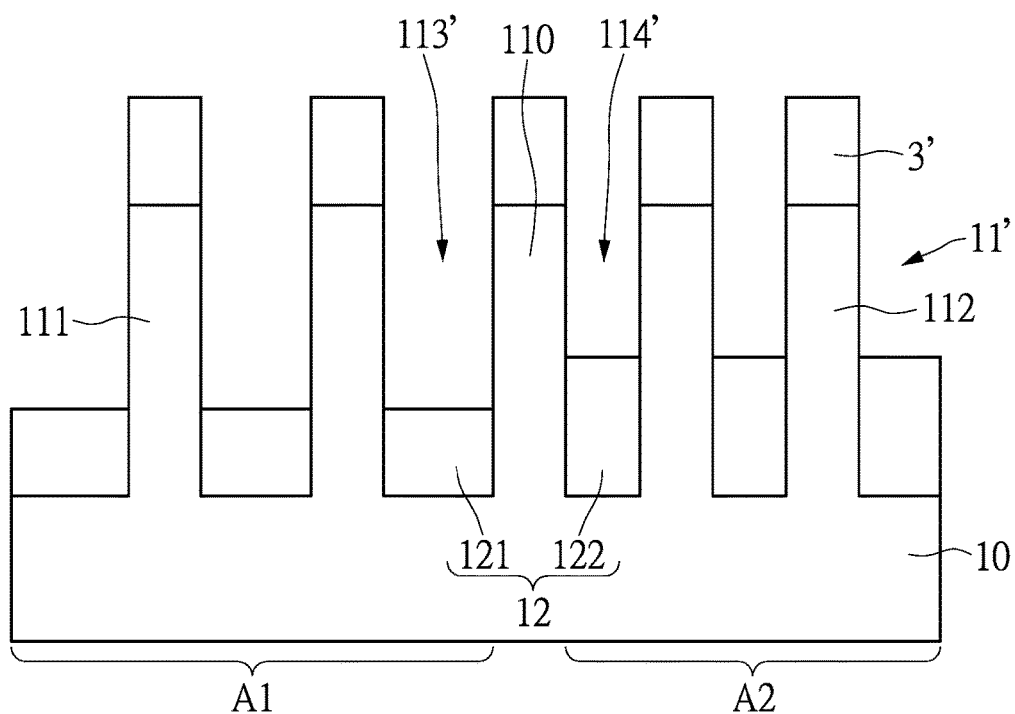
Figure 7E:
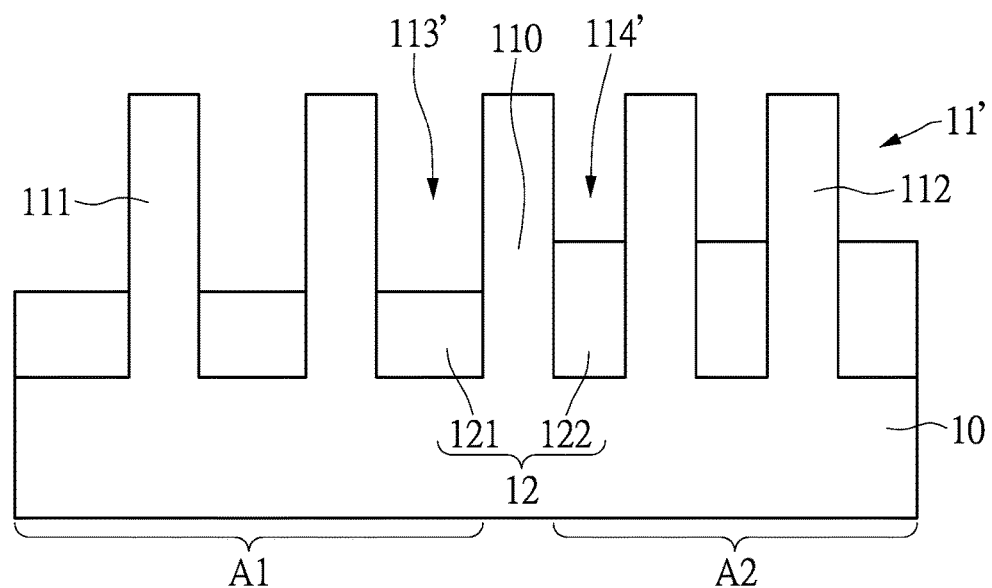

Please refer to FIGS. 7D and 7E. The isolation material 12b' formed in the first trenches 113 and the isolation material 12b formed in the second trenches 114 are etched with different etch rates to form the isolation structure 12. The isolation structure 12 includes the first isolation portion 121 and the second isolation portion 122. By etching the isolation materials 12b', 12b with different etch rates, the first and second isolation portions 121, 122 have different thicknesses.

The isolation materials 12b', 12b respectively formed in the first trenches 113' and the second trenches 114' are etched without the photoresist layer or the patterned shielding mask during the wet etching process. Since the width w1 of each first trench 113' is larger than the width w2 of each second trench 114', the contact area between the isolation material 12b' located in each first trench 113' and an etchant is larger than the contact area between the isolation material 12b located in each second trench 114' and the etchant. Accordingly, the etch rate of the isolation material 12b' formed in each first trench 113' is faster than that of the isolation material 12b formed in each second trench 114' so that the first isolation portion 121 formed in each first trench 113' is thinner than the second isolation portion 122 formed in each second trench 114'.

Notably, the wet etching process is taken as an example to describe the instant embodiment, but the dry etching process also can be used in conjunction with the patterned shielding mask in another embodiment to achieve the same result.

Figure 7F:
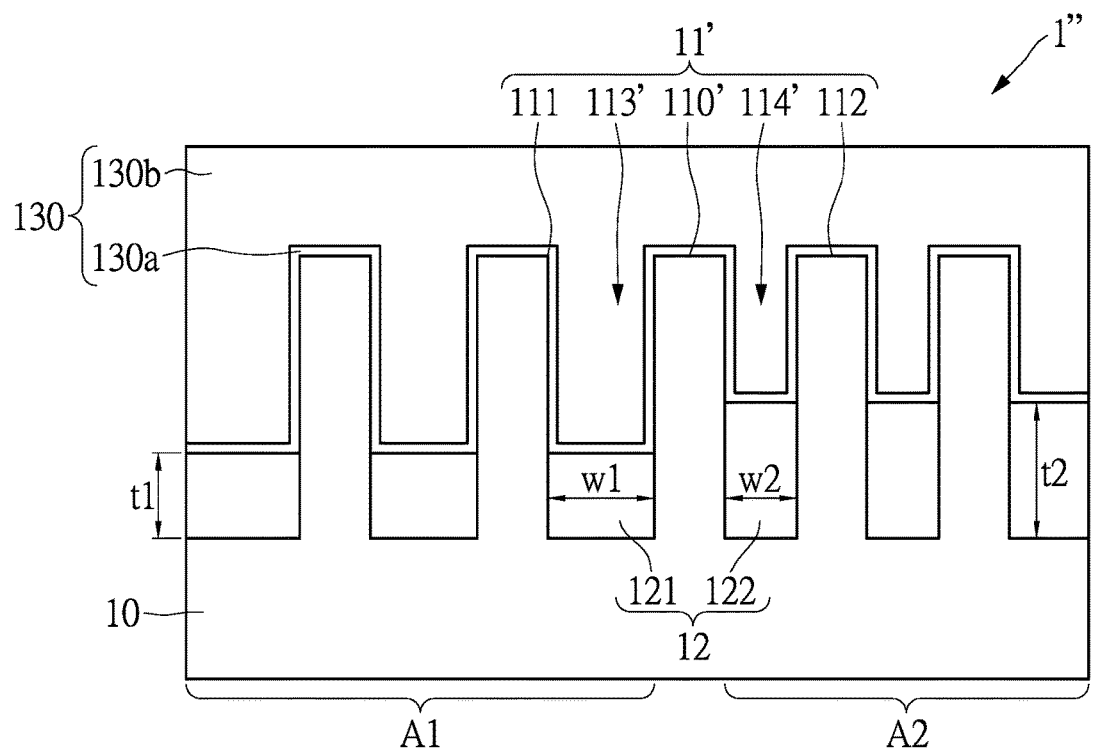

Subsequently, please refer to FIG. 7E and FIG. 7F. After the hard mask 3' is removed, the gate-stacked structure 13 is formed to cover the fin structure 11' and the substrate. The formation details of the gate-stacked structure 13 are similar to those shown in FIG. 6J and omitted herein.

To sum up, by making the isolation structure have different thicknesses in different portions, the inversion channel width of each fin is adjustable in the fin field-effect transistor and the manufacturing method thereof provided in the instant disclosure. Accordingly, the effective channel widths of the fin field-effect transistors in the embodiments of the instant disclosure can be adjusted based on practical demands of the integrated circuit design.

The descriptions illustrated supra set forth simply the preferred embodiments of the instant disclosure; however, the characteristics of the instant disclosure are by no means restricted thereto. All changes, alterations, or modifications conveniently considered by those skilled in the art are deemed to be encompassed within the scope of the instant disclosure delineated by the following claims.

What is claimed is:

1. A fin field-effect transistor comprising:
a substrate, wherein the substrate is divided into a first device region and a second device region;
a fin structure disposed on the substrate, wherein the fin structure includes a plurality of trenches, wherein the fin structure includes at least one first fin positioned at the first device region, at least one second fin positioned at the second device region, and a partition fin arranged between the first device region and the second device region;
an isolation structure arranged on the substrate and in the trenches, the isolation structure includes a first isolation portion positioned at the first device region and a second isolation portion positioned at the second device region, and the first isolation portion and the second isolation portion respectively have different thicknesses; and
a gate-stacked structure covering the fin structure and the isolation structure and including a plurality of gate-stacked stripes, wherein the gate-stacked stripes intersects with the first fin, the second fin, and the partition fin, each of the gate-stacked stripes includes a gate insulating layer and a gate conductive layer disposed on the gate insulating layer, one of the gate-stacked stripes includes a first stacked portion and a second stacked portion, the first stacked portion is only located at the first device region to cover the first fin and a portion of the partition fin, and the second stacked portion is only located at the second device region to cover the second fin and another portion of the partition fin,
wherein the first stacked portion and the second stacked portion are separated from each other by the partition fin to define an opening located on the partition fin, the gate insulating layer directly contacts and covers the first fin, the second fin, and the partition fin, and a portion of the gate insulating layer, which is located on a top surface of the partition fin, is exposed from the opening;
wherein the partition fin is a dummy fin, the partition fin having two opposite sidewall surfaces respectively connecting to the first isolation portion and the second isolation portion.

2. The fin field-effect transistor according to claim 1, wherein the first isolation portion has a smaller thickness than that of the second isolation portion.

3. The fin field-effect transistor according to claim 2, wherein a vertical distance between a top surface of the partition fin and a top surface of the first isolation portion is larger than a vertical distance between the top surface of the partition fin and a top surface of the second isolation portion.

4. The fin field-effect transistor according to claim 2, wherein one of the trenches defined between the first fin and the partition fin is a first trench, another one of the trenches defined between the second fin and the partition fin is a second trench, and the first trench has a larger width than that of the second trench.

5. The fin field-effect transistor according to claim 2, wherein the first and second fins are electrically connected to an external control circuit and the partition fin is insulated from the external control circuit.

6. The fin field-effect transistor according to claim 2, wherein the first stacked portion and the second stacked portion respectively cover two opposite sidewalls of the partition fin.

7. The fin field-effect transistor according to claim 6, wherein the first and second fins are electrically connected to an external control circuit and the partition fin is insulated from the external control circuit.

8. A manufacturing method of a fin field-effect transistor comprising:
forming a fin structure on a substrate, wherein the fin structure includes a plurality of trenches, wherein the substrate is divided into a first device region and a second device region, the fin structure includes at least one first fin positioned at the first device region, at least one second fin positioned at the second device region, and a partition fin arranged between the first device region and the second device region, the partition fin having two opposite sidewall surfaces, wherein the trenches include a first trench positioned at the first device region and a second trench positioned at the second device region, and the first trench has a larger width than that of the second trench;
forming an isolation structure disposed on the substrate and arranged in the first and second trenches, wherein the isolation structure has different thicknesses at different portions thereof the isolation structure includes a first isolation portion positioned at the first device region and a second isolation portion positioned at the second device region, and the first isolation portion and the second isolation portion respectively have different thicknesses and respectively connect the two opposite sidewall surfaces of the partition fin; and
forming a gate-stacked structure to cover the fin structure and the isolation structure, wherein the partition fin is a dummy fin;
wherein the step of forming the isolation structure further comprises:
forming an initial isolation material to fill the first and second trenches and cover the fin structure;
simultaneously etching a portion of the initial isolation material in the first trench with a first etch rate and another portion of the initial isolation material in the second trench with a second etch rate lower than the first etching rate to form the isolation structure without using any shielding mask, so that the first isolation portion formed in the first trench is thinner than the second isolation portion formed in the second trench.

9. The manufacturing method of a fin field-effect transistor according to claim 8, wherein the step of forming the fin structure further comprising:
forming an initial hard mask on an initial substrate;
forming a photoresist layer on the initial hard mask, wherein the photoresist layer includes a plurality of photoresist openings to define a plurality of positions respectively corresponding to the trenches;
etching the initial hard mask through the photoresist layer to form a hard mask having a plurality of openings, and the openings are respectively in communication with the photoresist openings;
etching the initial substrate through the photoresist layer and the hard mask to form the fin structure having a plurality of trenches; and
removing the photoresist layer.

10. The manufacturing method of a fin field-effect transistor according to claim 9, wherein the step of forming the isolation structure further comprising:
 after the step of forming the initial isolation material, removing a portion of the initial isolation material to expose a top face of the hard mask; and
 after the step of forming the first isolation portion and the second isolation portion, removing the hard mask.

11. The manufacturing method of a fin field-effect transistor according to claim 10, wherein a first trench and a second trench of the trenches are respectively positioned at the first device region and the second device region, and the first trench and the second trench have different widths.

12. The manufacturing method of a fin field-effect transistor according to claim 11, wherein the initial isolation material located in the first trench and the second trench is etched by an etchant to form the isolation structure, and a contact area between the initial isolation material in the first trench and the etchant is larger than a contact area between the initial isolation material in the second trench and the etchant.

13. A fin field-effect transistor comprising:
 a substrate;
 a fin structure disposed on the substrate, wherein the fin structure includes a plurality of fins and a plurality of trenches;
 an isolation structure arranged on the substrate and in the trenches, wherein the isolation structure includes a plurality of isolation portions respectively located in the trenches, each of the isolation portions in one of the trenches is divided into a front part and a rear part along an extending direction of each trench, the front part and the rear part of each isolation portion are located in the same trench and connected to the same fin, and the front part has a thickness with respect to the substrate different from that of the rear part; and
 a gate-stacked structure covering the fin structure and the isolation structure;
 wherein each of the isolation portions is arranged in one of the trenches without passing through the fin connected thereto, and a vertical distance between a top surface of each part of each isolation portion and a bottom surface of the substrate is smaller than a vertical distance between a top surface of each fin and the bottom surface of the substrate.

14. The fin field-effect transistor according to claim 13, wherein the gate-stacked structure includes a first gate-stacked stripe and a second gate-stacked stripe, the first gate-stacked stripe and the second gate-stacked stripe are disposed on the same fin, the first gate-stacked stripe covers the front part of each isolation portion, and the second gate-stacked stripes covers the rear part of each isolation portion.

15. The fin field-effect transistor according to claim 13, wherein the trenches have the same depths, each of the fins connects to at least one isolation portion, a vertical distance between a top surface of each fin and a top surface of the front part is smaller than that between the top surface of each fin and a top surface of the rear part.

\* \* \* \* \*